(12) United States Patent
Zhang et al.

(10) Patent No.: US 11,854,741 B2
(45) Date of Patent: Dec. 26, 2023

(54) CAPACITOR SEAT PLATE ASSEMBLY

(71) Applicant: CAPXON ELECTRONIC TECHNOLOGY CO., LTD, Shenzhen (CN)

(72) Inventors: Wanhong Zhang, Shenzhen (CN); Runshen Wang, Shenzhen (CN); Yizhu Lin, Taiwan (CN); Wei Yan, Shenzhen (CN); Yang Du, Shenzhen (CN)

(73) Assignee: CAPXON ELECTRONIC TECHNOLOGY CO., LTD, Shenzhen (CN)

( * ) Notice: Subject to any disclaimer, the term of this patent is extended or adjusted under 35 U.S.C. 154(b) by 0 days.

(21) Appl. No.: 17/847,338

(22) Filed: Jun. 23, 2022

(65) Prior Publication Data

US 2022/0319780 A1 Oct. 6, 2022

(30) Foreign Application Priority Data

Nov. 2, 2021 (CN) .......................... 202111290336.2
Nov. 2, 2021 (CN) .......................... 202122660389.0

(51) Int. Cl.
*H01G 2/06* (2006.01)
*H01G 9/08* (2006.01)
*H01G 9/10* (2006.01)
*H01G 2/10* (2006.01)

(52) U.S. Cl.
CPC .................. *H01G 2/06* (2013.01); *H01G 9/08* (2013.01); *H01G 9/10* (2013.01); *H01G 2/10* (2013.01)

(58) Field of Classification Search
CPC .................................. H01G 2/06; H01G 9/08
See application file for complete search history.

(56) References Cited

U.S. PATENT DOCUMENTS

2007/0002527 A1* 1/2007 Hsieh ..................... H01G 2/08
361/600
2012/0162860 A1* 6/2012 Taketani ................ H01G 9/012
29/832
2020/0402713 A1* 12/2020 Ishimaru .................. H01G 2/02

FOREIGN PATENT DOCUMENTS

| CN | 206991951 U | * | 2/2018 |
| CN | 207529815 U | * | 6/2018 |
| CN | 207529815 U | | 6/2018 |
| CN | 109585172 A | | 4/2019 |
| CN | 210378760 U | | 4/2020 |
| JP | H1064756 A | * | 6/1998 |
| JP | 2006156860 A | * | 6/2006 |

* cited by examiner

*Primary Examiner* — Eric W Thomas

(57) ABSTRACT

A seat plate assembly for fixing a capacitor on a circuit board, including a base plate, a first guard plate, a second guard plate, a third guard plate, a fourth guard plate, a first reinforcing rib and a second reinforcing rib. The first guard plate, the second guard plate, the third guard plate and the fourth guard plate are provided spaced apart on an upper end surface of the base plate in sequence. The first reinforcing rib is configured to connect the first guard plate with the second guard plate. The second reinforcing rib is configured to connect the third guard plate with the fourth guard plate.

9 Claims, 6 Drawing Sheets

CAPACITOR SEAT PLATE ASSEMBLY

CROSS-REFERENCE TO RELATED APPLICATIONS

This application claims the benefit of priority from Chinese Patent Application Nos. 202111290336.2 and 202122660389.0, both filed on Nov. 2, 2021. The content of the aforementioned application, including any intervening amendments thereto, is incorporated herein by reference in its entirety.

TECHNICAL FIELD

This application relates to capacitors, and more specifically to a capacitor seat plate assembly.

BACKGROUND

Capacitors, as an indispensable part of a circuit, have been widely used in electronic devices, which are fixed on a circuit board by soldering. With the continuous expansion of the application, the electronic devices may be subjected to some harsh application conditions. Particularly exposed to large vibration, the capacitor is prone to loosening or falling off from the circuit board, which will cause the operation failure. Even for the existing anti-vibration capacitors, it is still difficult to ensure a firm connection between the capacitor and the circuit board in a high-frequency and high-amplitude working environment.

SUMMARY

In order to overcome the deficiencies of the prior art, the present disclosure provides a capacitor seat plate assembly by arranging guard plates on a base plate and arranging reinforcing ribs between the guard plates to make the guard plates be connected together and more firmly, so as to increase a supporting area for the capacitor body. Furthermore, the capacitor seat plate assembly can reduce a deformation and resonance of a first guard plate, a second guard plate, a third guard plate and a fourth guard plate, so that a capacitor body can be more stably installed on the circuit board. Therefore, the capacitor seat plate assembly in the present disclosure has a stronger anti-vibration ability, which solves the problem that the capacitor is prone to loosening or falling off from the circuit board.

The technical solutions of the present disclosure are described as follows.

In a first aspect, this application provides a capacitor seat plate assembly for fixing a capacitor body on a circuit board, comprising:
 a base plate;
 a first guard plate;
 a second guard plate;
 a third guard plate;
 a fourth guard plate;
 a first reinforcing rib; and
 a second reinforcing rib;
 wherein the first guard plate, the second guard plate, the third guard plate and the fourth guard plate are arranged spaced apart on an upper end surface of the base plate in sequence;
 the first reinforcing rib is configured to connect the first guard plate with the second guard plate; and
 the second reinforcing rib is configured to connect the third guard plate with the fourth guard plate.

In an embodiment, the base plate is provided with a first through hole and a second through hole;
 a lower end surface of the base plate is provided with a first groove and a second groove;
 the first groove and the second groove are arranged spaced apart and opposite to each other;
 the first through hole is communicated with the first groove; and
 the second through hole is communicated with the second groove.

In an embodiment, a first notch and a second notch are arranged spaced apart on the base plate.

In an embodiment, a height of the first guard plate is equal to a height of the third guard plate;
 a height of the second guard plate is equal to a height of the fourth guard plate;
 the height of the first guard plate and the third guard plate is lower than half of a height of the capacitor body; and
 the height of the second guard plate and the fourth guard plate is larger than half of the height of the capacitor body.

In an embodiment, a first welding part is arranged in the first groove;
 a second welding part is arranged in the second groove; and
 the capacitor seat plate assembly is welded on the circuit board through the first welding part and the second welding part.

In an embodiment, the first welding part comprises a first end, a first intermediate portion and a second end connected in sequence;
 the first intermediate portion is arranged in the first groove; the first intermediate portion fits the first groove;
 the first end and the second end are arranged on the base plate; the first end is arranged and exposed at a first side of the first groove;
 the second end is arranged and exposed at a second side of the first groove;
 the first side of the first groove is opposite to the second side of the first groove;
 the second welding part comprises a third end, a second intermediate portion and a fourth end which are connected in sequence;
 the second intermediate portion is arranged in the second groove; the second intermediate portion fits the second groove;
 the third end and the fourth end are arranged on the base plate;
 the third end is arranged on a first side of the second groove;
 the fourth end is arranged on a second side of the second groove; and
 the first side of the second groove is opposite to the second side of the second groove.

In an embodiment, the first welding part further comprises a fifth end;
 the fifth end is connected to the first intermediate portion;
 the fifth end is configured to extend to or out of a boundary of the base plate along the first groove;
 the second welding part further comprises a sixth end;
 the sixth end is connected to the second intermediate portion; and
 the sixth end is configured to extend to or out of a boundary of the base plate along the second groove.

In an embodiment, the base plate is further provided with a third through hole and a fourth through hole;

the third through hole is communicated with the second groove; and the fourth through hole is communicated with the first groove.

In an embodiment, the capacitor seat plate assembly further comprises an auxiliary soldering lug;

the auxiliary soldering lug is arranged on a lower end surface of the base plate; and the auxiliary soldering lug is configured for welding the base plate on the circuit board.

In a second aspect, this application also provides an anti-vibration capacitor assembly, comprising:

the capacitor body; and the capacitor seat plate assembly;

wherein the capacitor seat plate assembly is configured to support the capacitor body.

Compared to the prior art, the present disclosure has the following beneficial effects.

The capacitor seat plate assembly is fixed on the circuit board. The capacitor body is arranged on the base plate. The capacitor body is arranged in the middle of the first guard plate, the second guard plate, the third guard plate and the fourth guard plate. The first guard plate, the second guard plate, the third guard plate and the fourth guard plate all abut against an outer side wall of the capacitor body, so as to fix the capacitor body on the capacitor seat plate assembly.

In addition, the first reinforcing rib in the present disclosure is configured to connect the first guard plate with the second guard plate, and the second reinforcing rib is configured to connect the third guard plate with the fourth guard plate, increasing a contact area with an outer side wall of the capacitor body.

Furthermore, the capacitor seat plate assembly can reduce a deformation and resonance of a first guard plate, a second guard plate, a third guard plate and a fourth guard plate, so that a capacitor body can be more stably installed on the capacitor seat plate assembly. Therefore, the capacitor seat plate assembly in the present disclosure has a stronger anti-vibration ability, which solves the problem that the capacitor is prone to loosening or falling off from the circuit board, and has a great promotion value and practicability.

Figure 1:
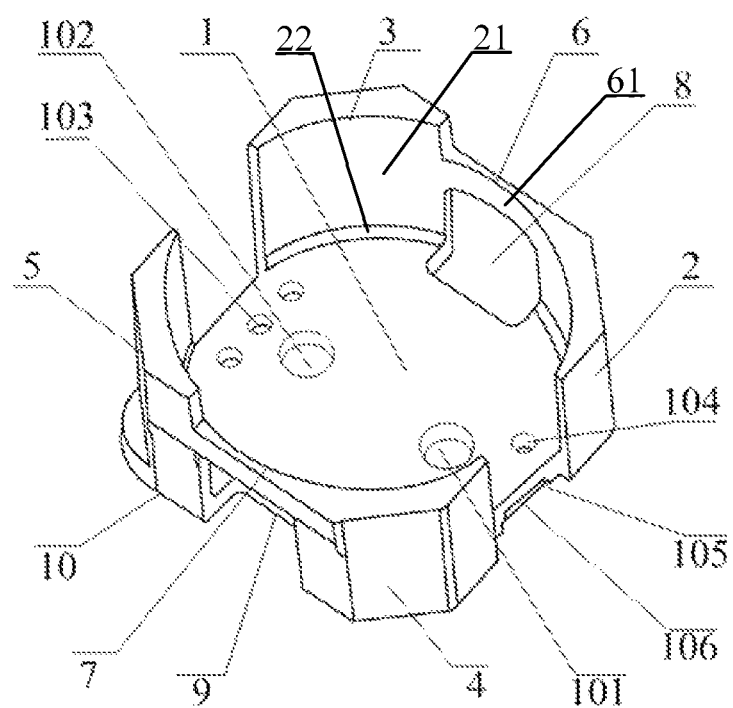
FIG. 1 is a perspective view of a structure of a capacitor seat plate assembly according to an embodiment of the present disclosure.

In the drawings: 1, base plate; 2, first guard plate; 21, first recess; 22, arc structure; 3, second guard plate; 4, third guard plate; 5, fourth guard plate; 6, first reinforcing rib; 61, second recess; 7, second reinforcing rib; 8, first notch; 9, second notch; 10, seat plate assembly; 11, capacitor body; 101, first through hole; 102, second through hole; 103, third through hole; 104, fourth through hole; 105, first groove; 106, first welding part; 1061, first end; 1062, first intermediate portion; 1063, second end; 1064, fifth end; 107, second groove; 108, second welding part; 1081, third end; 1082, second intermediate portion; 1083, fourth end; 1084, sixth end; 109, auxiliary soldering lug; 111, first lead wire; and 112, second lead wire.

DETAILED DESCRIPTION OF EMBODIMENTS

The disclosure will be described completely and clearly below with reference to the accompanying drawings and embodiments to make the object, technical solutions, and beneficial effects of the present disclosure clearer.

Figure 2:
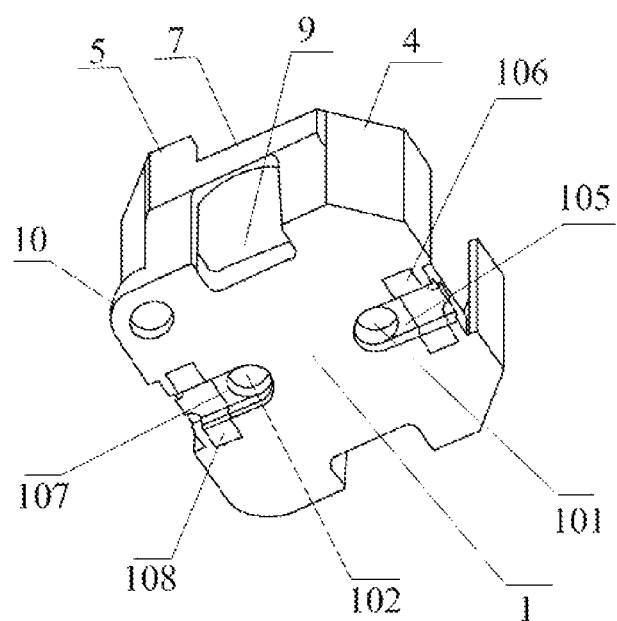
FIG. 2 is another perspective view of the structure of the capacitor seat plate assembly according to an embodiment of the present disclosure.
Figure 3:
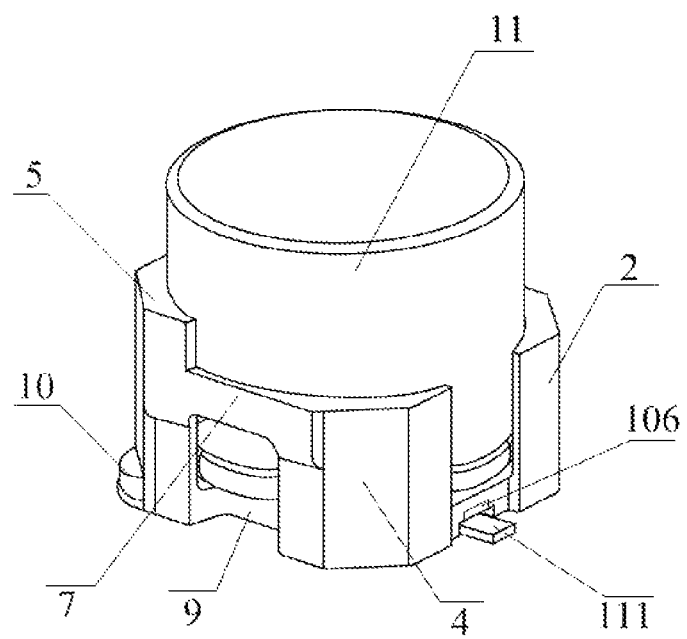
FIG. 3 is a perspective view schematically depicting assembly of a capacitor body on the capacitor seat plate assembly according to an embodiment of the present disclosure.

As shown in FIGS. 1-3, the present disclosure provides a seat plate assembly 10 for fixing a capacitor body 11 on a circuit board, which includes a base plate 1, a first guard plate 2, a second guard plate 3, a third guard plate 4, a fourth guard plate 5, a first reinforcing rib 6 and a second reinforcing rib 7. The first guard plate 2, the second guard plate 3, the third guard plate 4 and the fourth guard plate 5 are arranged spaced apart on an upper end surface of the base plate 1 in sequence. The first reinforcing rib 6 is configured to connect the first guard plate 2 with the second guard plate 3. The second reinforcing rib 7 is configured to connect the third guard plate 4 with the fourth guard plate 5.

The capacitor seat plate assembly 10 is fixed on the circuit board. The capacitor body 11 is arranged on the base plate 1. The capacitor body 11 is arranged in the middle of the first guard plate 2, the second guard plate 3, the third guard plate 4 and the fourth guard plate 5. The first guard plate 2, the second guard plate 3, the third guard plate 4 and the fourth guard plate 5 all abut against an outer side wall of the capacitor body 11, so as to fix the capacitor body 11 on the capacitor seat plate assembly 10. In addition, the first reinforcing rib 6 is configured to connect the first guard plate 2 with the second guard plate 3, and the second reinforcing rib 7 is configured to connect the third guard plate 4 with the fourth guard plate 5, increasing a contact area with an outer side wall of the capacitor body 11, so that a capacitor body 11 can be more stably installed on the capacitor seat plate assembly 10. Therefore, the capacitor body 11 has a stronger anti-vibration ability, which solves the problem that the capacitor body 11 is prone to loosening or falling off from the circuit board.

Particularly, the arrangement of the first reinforcing rib 6 enables the structural integration of the first guard plate 2 and the second guard plate 3. The first guard plate 2 and the second guard plate 3 are connected together to bear a force together under an action of the first reinforcing rib 6. On one hand, a deformation and resonance of the first guard plate 2 and the second guard plate 3 are weakened when they are under the force. On the other hand, a contact area of the first guard plate 2 and the second guard plate 3 with the capacitor body 11 is increased, so that the capacitor body 11 is more firmly fixed on the capacitor seat plate assembly 10. The arrangement of the second reinforcing rib 7 enables the structural integration of the third guard plate 4 and the fourth guard plate 5. The third guard plate 4 and the fourth guard plate 5 are connected together to bear a force together under an action of the second reinforcing rib 7. On one hand, a deformation and resonance of the third guard plate 4 and the fourth guard plate 5 are weakened when they are under the force. On the other hand, a contact area of the third guard plate 4 and the fourth guard plate 5 with the capacitor body 11 is further increased, so that the capacitor body 11 is more firmly fixed on the capacitor seat plate assembly 10.

In an embodiment, as shown in FIG. 1, sides of the first guard plate 2, the second guard plate 3, the third guard plate 4 and the fourth guard plate 5 facing the capacitor body 11 have a first recess 21, respectively. The first recess 21 fits the outer side wall of the capacitor body 11, so as to make the first guard plate 2, the second guard plate 3, the third guard plate 4 and the fourth guard plate 5 more reliably abut against the outer side wall of the capacitor body 11, so that the capacitor body 11 is more firmly fixed to the capacitor seat plate assembly 10.

In an embodiment, as shown in FIG. 1, a connection between the first guard plate 2, the second guard plate 3, the third guard plate 4 and the fourth guard plate 5 and the base plate 1 is an arc structure 22. The arc structure 22 enables the first guard plate 2, the second guard plate 3, the third guard plate 4 and the fourth guard plate 5 to more reliably fix the capacitor body 11.

In an embodiment, as shown in FIG. 1, a side of the first reinforcing rib 6 and a side of the second reinforcing rib 7 facing the capacitor body 11 have a second recess 61. The second recess 61 fits a shape of the outer side wall of the capacitor body 11, so that the first reinforcing rib 6 and the second reinforcing rib 7 can more reliably abut against the outer side wall of the capacitor body 11, and the capacitor body 11 is more firmly fixed on the capacitor seat plate assembly 10.

In an embodiment, as shown in FIGS. 1-2, the base plate 1 is provided with a first through hole 101 and a second through hole 102. A lower end surface of the base plate 1 is provided with a first groove 105 and a second groove 107. The first groove 105 and the second groove 107 are arranged spaced apart and opposite to each other. The first through hole 101 is communicated with the first groove 105. The second through hole 102 is communicated with the second groove 107. In this embodiment, an end of the first groove 105 away from the second groove 107 extends to an edge of the base plate 1, and an end of the second groove 107 away from the first groove 105 extends to an edge of the base plate 1.

Figure 4:
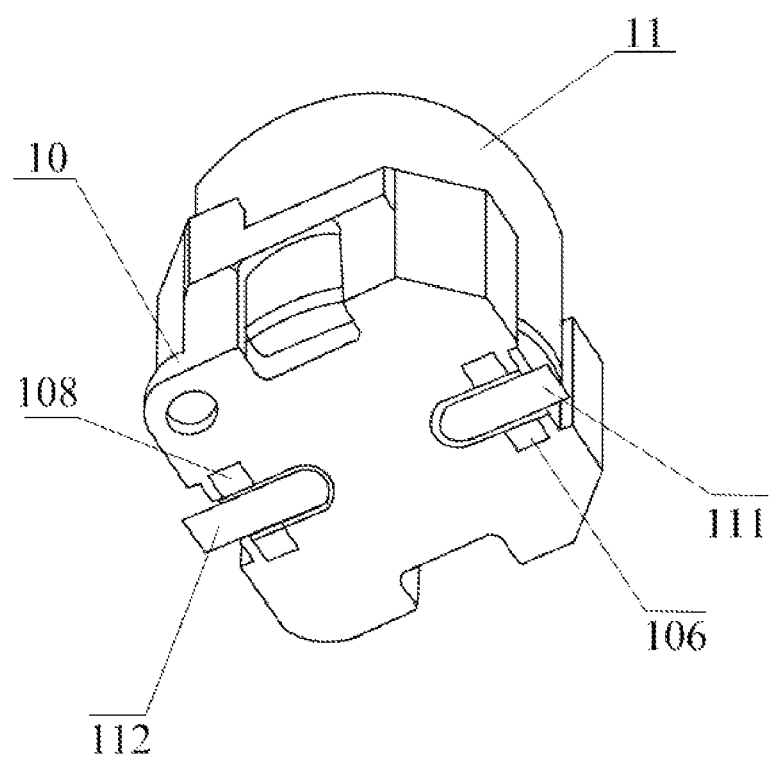
FIG. 4 is another perspective view schematically depicting the assembly of the capacitor body on the capacitor seat plate assembly according to an embodiment of the present disclosure.

Specifically, as shown in FIGS. 3-4, the capacitor body 11 has a first lead wire 111 and a second lead wire 112. The first lead wire 111 passes through the first through hole 101 and extends out of the base plate 1 along the first groove 105. The second lead wire 112 passes through the second through hole 102, and extends out of the base plate 1 along the second groove 107. In this embodiment, the first lead 111 is bent toward the first groove 105 after passing through the first through hole 101, so that the first lead wire 111 is fit in the first groove 105. The second lead wire 112 is bent toward the second groove 107 after passing through the second through hole 102, so that the second lead 112 is fit in the second groove 107.

In an embodiment, as shown in FIG. 1, the base plate 1 is provided with a first notch 8 and a second notch 9. The first notch 8 and the second notch 9 are arranged spaced apart. Specifically, the first notch 8 and the second notch 9 make an inside of the capacitor seat plate assembly 10 communicate with the outside air, and the arrangements of the first notch 8 and the second notch 9 allow a part of the capacitor body 11 to be exposed in the outside air, which is beneficial to dissipate the heat of the capacitor body 11.

In an embodiment, as shown in FIG. 1, a height of the first guard plate 2 is equal to a height of the third guard plate 4. A height of the second guard plate 3 is equal to a height of the fourth guard plate 5. The height of the first guard plate 2 and the third guard plate 4 is lower than half of a height of the capacitor body 11. The height of the second guard plate 3 and the fourth guard plate 5 is larger than half of the height of the capacitor body 11. Specifically, the height of the second guard plate 3 and the fourth guard plate 5 is larger than half of the height of the capacitor body 11, so that the second guard plate 3 and the fourth guard plate 5 can abut against an upper half of the capacitor body 11, so as to avoid the upper half of the capacitor body 11 from shaking violently without a resistance force in the high-frequency and high-amplitude working environment. In addition, since the upper half of the capacitor body 11 has been securely fixed by the second guard plate 3 and the fourth guard plate 5, and the height of the first guard plate 2 and the third guard plate 4 is set to be lower than half the height of the capacitor body 11, so that the capacitor body 11 can be more in contact with the outside air, so as to facilitate the heat dissipation of the capacitor body 11. The height of the first guard plate 2 and the third guard plate 4 is set to be lower than half of the height of the capacitor body 11, which can save materials.

In an embodiment, as shown in FIG. 1, one end of the first reinforcing rib 6 is connected with a top end of the first guard plate 2; the other end of the first reinforcing rib 6 is connected with the second guard plate 3. The first reinforcing rib 6 is arranged horizontally. One end of the second reinforcing rib 7 is connected to a top end of the third guard plate 4; the other end of the second reinforcing rib 7 is connected to the fourth guard plate 5. The second reinforcing rib 7 is arranged horizontally. Specifically, in other embodiments, the other end of the second reinforcing rib 7 may also be connected to a top end of the fourth guard plate 5.

Figure 5:
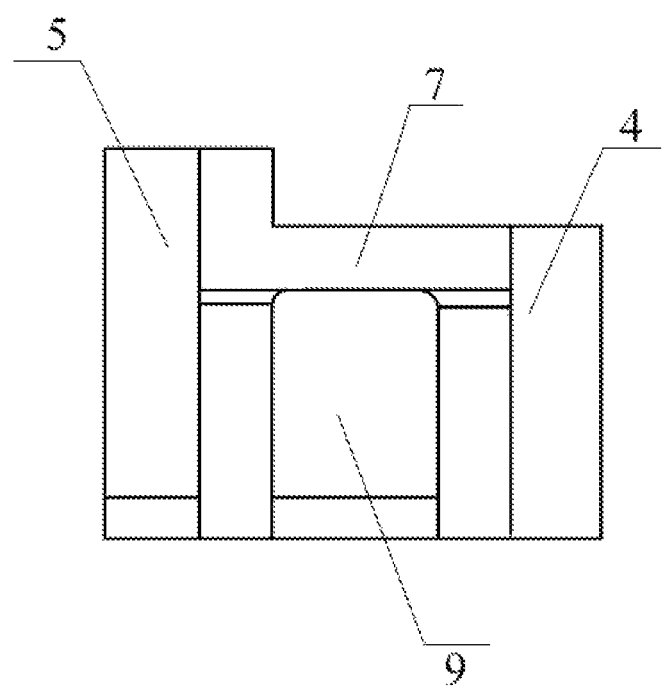
FIG. 5 is a side view of an anti-vibration capacitor assembly according to an embodiment of the present disclosure.

Specifically, as shown in FIGS. 1-2 and 5, the arrangements of the first reinforcing rib 6 and the second reinforcing rib 7 make a first opening formed between the first guard plate 2 and the second guard plate 3 and a second opening formed between the third guard plate 4 and the fourth guard plate 5. In this embodiment, the first notch 8 is located just below the first opening, and the second notch 9 is located just below the second opening, so that the first notch 8 and the second notch 9 become a L-shaped notch.

In an embodiment, as shown in FIG. 2, a first welding part 106 is arranged in a first groove 105. A second welding part 108 is arranged in a second groove 107. The capacitor seat plate assembly 10 is welded on the circuit board through the first welding part 106 and the second welding part 108. In this embodiment, the first lead wire 111 is welded on the first welding part 106. The first welding part 106 is welded on the circuit board. The second lead wire 112 is welded on the second welding part 108. The second welding part 108 is welded on the circuit board.

In an embodiment, the first welding part 106 and the second welding part 108 are made of a metal material. The metal material has a good thermal conductivity, so that the arrangements of the first welding part 106 and the second welding part 108 are also beneficial to dissipate the heat of the capacitor seat plate assembly 10 and the capacitor body 11.

Figure 6:
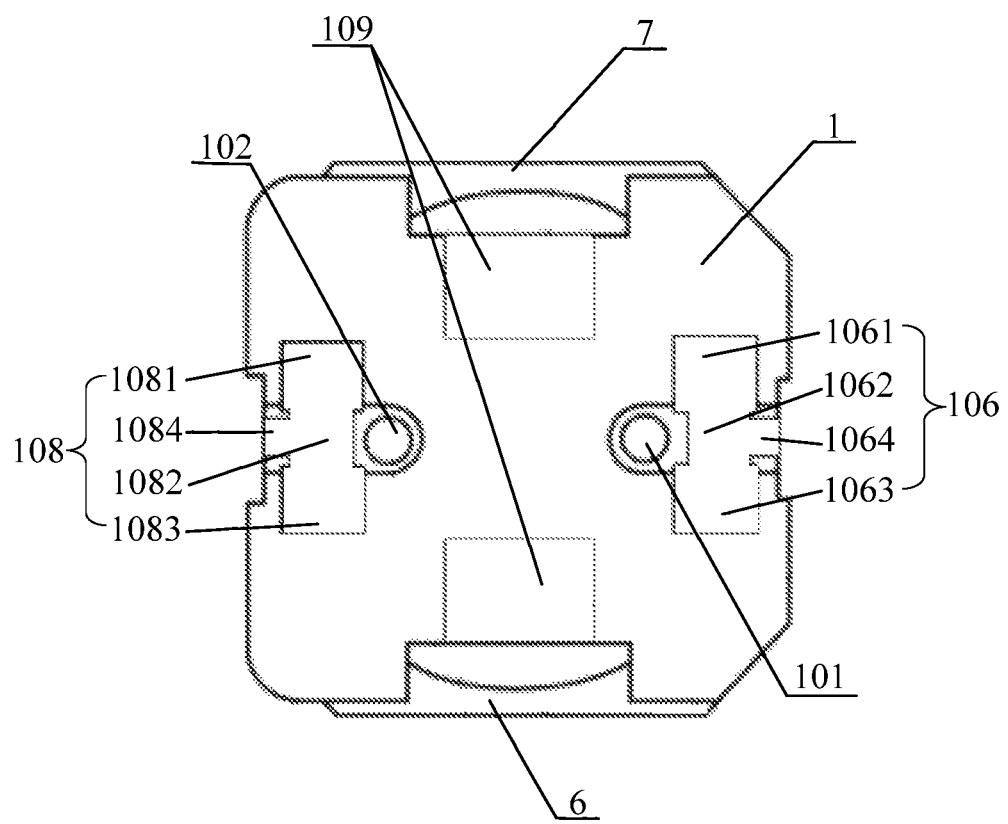
FIG. 6 is a top view of the anti-vibration capacitor assembly according to another embodiment of the present disclosure.

In an embodiment, as shown in FIG. 6, the first welding part 106 includes a first end 1061, a first intermediate portion 1062 and a second end 1063 which are connected in sequence. The first intermediate portion 1062 is arranged in the first groove 105. The first intermediate portion 1062 fits the first groove 105. The first end 1061 and the second end 1063 are arranged on the base plate 1. The first end 1061 is arranged at a first side of the first groove 105. The second end 1063 is arranged at a second side of the first groove 105. The first side of the first groove 105 is opposite to the second side of the first groove 105. In this embodiment, an intermediate portion of the first welding part 106 is recessed toward the first groove 105 to form the first intermediate portion 1062. The first welding part 106 is exposed at the first side of the first groove 105, which is the first end 1061. The first welding part 106 is exposed at the second side of the first groove 105, which is the second end 1063. The first intermediate portion 1062 is in contact with the first lead wire 111. The first lead wire 111 is electrically connected to and the first welding part 106. In this embodiment, the first end 1061 and the second end 1063 are a square. In other embodiments, the first end 1061 and the second end 1063 can be a circle, an irregular figure, or other polygons.

Specifically, when the capacitor seat plate assembly 10 is welded on the circuit board by the first welding part 106 and the second welding part 108, the first end 1061, the first intermediate portion 1062 and the second end 1063 are all welded on the circuit board. The arrangements of the first end 1061 and the second end 1063 make that the first welding part 106 has a larger welding area with the circuit board, so that the capacitor body 11 and the capacitor seat plate assembly 10 are more firmly welded and fixed on the circuit board, which further improves the anti-vibration performance of the capacitor body 11. In addition, the arrangements of the first end 1061 and the second end 1063 make an area of the first welding part 106 lager, thereby further facilitating the heat dissipation of the capacitor seat plate assembly 10 and the capacitor body 11.

In an embodiment, as shown in FIG. 6, the second welding part 108 includes a third end 1081, a second intermediate portion 1082 and a fourth end 1083 which are connected in sequence. The second intermediate portion 1082 is arranged in the second groove 107. The second intermediate part 1082 fits the second groove 107. The third end 1081 and the fourth end 1083 are arranged on the base plate 1. The third end 1081 is arranged on a first side of the second groove 107. The fourth end 1083 is arranged on a second side of the second groove 107. The first side of the second groove 107 is opposite to the second side of the second groove 107. In this embodiment, the intermediate portion of the second welding part 108 is recessed toward the second groove 107 to form the second intermediate portion 1082. The second welding part 108 is exposed at the first side of the second groove 107, which is the third end 1081. The second welding part 108 is exposed at the second side of the second groove 107, which is the fourth end 1083. The second intermediate portion 1082 is in contact with the second lead wire 112. The second lead wire 112 is electrically connected to the second welding part 108. In this embodiment, the third end 1081 and the fourth end 1083 are a square. In other embodiments, the third end 1081 and the fourth end 1083 are can be a circle, an irregular figure, or other polygons.

Specifically, when the capacitor seat plate assembly 10 is welded on the circuit board by the first welding part 106 and the second welding part 108, the third end 1081, the second intermediate portion 1082 and the fourth end 1083 are all welded on the circuit board. The arrangements of the third end 1081 and the fourth end 1083 make that the second welding part 108 has a larger welding area with the circuit board, so that the capacitor body 11 and the capacitor seat plate assembly 10 are more firmly welded and fixed on the circuit board, which further improves the anti-vibration performance of the capacitor body 11. In addition, the arrangements of the third end 1081 and the fourth end 1083 make an area of the second welding part 108 larger, thereby further facilitating the heat dissipation of the capacitor seat plate assembly 10 and the capacitor body 11.

In an embodiment, as shown in FIG. 6, the first welding part 106 further includes a fifth end 1064. The fifth end 1064 is connected to the first intermediate portion 1062. The fifth end 1064 is configured to extend to or out of a boundary of the base plate 1 along the first groove 105. Specifically, when the capacitor body 11 and the capacitor seat plate assembly 10 are mounted and welded on the circuit board, the fifth end 1064 also acts as a welding surface, thereby increasing a welding area between the first welding part 106 and the circuit board, so that the capacitor body 11 and the capacitor seat plate assembly 10 are more firmly welded and fixed on the circuit board, which further improves the anti-vibration performance of the capacitor body 11.

In an embodiment, as shown in FIG. 6, the second welding part 108 further includes a sixth end 1084. The sixth end 1084 is connected to a second intermediate portion 1082. The sixth end 1084 is configured to extend to or out of a boundary of the base plate 1 along the second groove 107. When the capacitor body 11 and the capacitor seat plate assembly 10 are mounted and welded on the circuit board, the sixth end 1084 also acts as a welding surface, thereby increasing a welding area between the second welding part 108 and the circuit board, so that the capacitor body 11 and the capacitor seat plate assembly 10 are more firmly welded and fixed on the circuit board, which further improves the anti-vibration performance of the capacitor body 11. On the other hand, when the capacitor seat plate assembly 10 is welded on the circuit board, a welding temperature is also more easily transferred to the first lead wire 111 and the second lead wire 112 through the third end 1081 and the sixth end 1084, so that a temperature of the first lead wire 111 the second lead wire 112 can be quickly stable, which improves the stability and efficiency of welding.

In an embodiment, as shown in FIG. 1, the base plate 1 is provided with a third through hole 103 and a fourth through hole 104. The third through hole 103 is communicated with the second groove 107. The fourth through hole 104 is communicated with the first groove 105. The heat in the capacitor body 11 is transferred to the second groove 107 and the first groove 105 through the third through hole 103 and the fourth through hole 104, and transferred to the second welding part 108 and the first welding part 106, so as to remove a portion of the heat by transferring to the circuit board through the first welding part 106 and the second welding part 108.

In an embodiment, as shown in FIG. 1, there are a plurality of third through holes 103 and a plurality of fourth through holes 104. The plurality of third through holes 103 and the plurality of fourth through holes 104 are arranged spaced apart on the base plate 1. The heat in the capacitor body 11 can be transferred to the second groove 107 and the first groove 105 more quickly through the plurality of third through holes 103 and the plurality of fourth through holes 104, and transferred to the second welding part 108 and the first welding part 106, thereby improving the heat dissipation efficiency.

In other embodiments, the third through hole 103 and the fourth through hole 104 are filled with a heat dissipation material. Specifically, the heat dissipation material is the same as the material of the first welding part 106, or the heat dissipation material is made of other materials with good heat dissipation such as aluminum. In this embodiment, the third through hole 103 and the fourth through hole 104 are hollow, and there is no heat dissipation material.

In an embodiment, the second welding part 108 covers one end of the third through hole 103. The first welding part 106 covers one end of the fourth through hole 104, so that the heat in the capacitor body 11 can be transferred to the second welding part 108 and the first welding part 106 more easily through the third through hole 103 and the first through hole 104 for heat dissipation.

In an embodiment, as shown in FIG. 6, the capacitor seat plate assembly 10 further includes an auxiliary soldering lug 109. The auxiliary soldering lug 109 is arranged on a lower end surface of the base plate 1. The auxiliary soldering lug 109 is configured for welding the base plate 1 on the circuit board. Specifically, the auxiliary soldering lug 109 is matched with the first welding part 106 and the second welding part 108, so that the capacitor seat plate assembly 10 can be welded on the circuit board more reliably.

In an embodiment, as shown in FIG. 6, there are a plurality of auxiliary soldering lugs 109. The plurality of auxiliary soldering lugs 109 makes the capacitor seat plate assembly 10 be welded and fixed on the circuit board more firmly. In this embodiment, there are two auxiliary soldering lugs 109.

In an embodiment, the auxiliary soldering lug 109 is made of a heat dissipation material, which is conducive to the heat dissipation of the capacitor body 11.

In an embodiment, the auxiliary soldering lug 109 is a circle or a polygon.

In an embodiment, as shown in FIG. 3, the present disclosure further provides an anti-vibration capacitor assembly, which includes the capacitor body 11 and the capacitor seat plate assembly 10. The capacitor seat plate assembly 10 is configured for supporting the capacitor body 11.

The embodiments provided in the accompanying drawings are merely illustrative, and are not intended to limit the scope of the present disclosure. It should be understood that any modifications, replacements and improvements made by those skilled in the art without departing from the spirit and scope of the present disclosure should fall within the scope of the present disclosure defined by the appended claims.

What is claimed is:

1. A seat plate assembly for fixing a capacitor body on a circuit board, comprising:
a base plate;
a first guard plate;
a second guard plate;
a third guard plate;
a fourth guard plate;
a first reinforcing rib; and
a second reinforcing rib;
wherein the first guard plate, the second guard plate, the third guard plate and the fourth guard plate are arranged spaced apart on an upper end surface of the base plate in sequence;
the first reinforcing rib is configured to connect the first guard plate with the second guard plate; and
the second reinforcing rib is configured to connect the third guard plate with the fourth guard plate; and
wherein a height of the first guard plate is equal to a height of the third guard plate;
a height of the second guard plate is equal to a height of the fourth guard plate;
the height of the first guard plate and the third guard plate is lower than half of a height of the capacitor body; and
the height of the second guard plate and the fourth guard plate is larger than half of the height of the capacitor body.

2. The seat plate assembly of claim 1, wherein the base plate is provided with a first through hole and a second through hole;
a lower end surface of the base plate is provided with a first groove and a second groove;
the first groove and the second groove are arranged spaced apart and opposite to each other;
the first through hole is communicated with the first groove; and
the second through hole is communicated with the second groove.

3. The seat plate assembly of claim 2, wherein a first welding part is arranged in the first groove;
a second welding part is arranged in the second groove; and
the seat plate assembly is welded on the circuit board through the first welding part and the second welding part.

4. The seat plate assembly of claim 3, wherein the first welding part comprises a first end, a first intermediate portion and a second end connected in sequence;
the first intermediate portion is arranged in the first groove; the first intermediate portion fits the first groove;
the first end and the second end are arranged on the base plate; the first end is arranged at a first side of the first groove;
the second end is arranged at a second side of the first groove;
the first side of the first groove is opposite to the second side of the first groove;
the second welding part comprises a third end, a second intermediate portion and a fourth end connected in sequence;
the second intermediate portion is arranged in the second groove; the second intermediate portion fits the second groove;
the third end and the fourth end are arranged on the base plate;
the third end is arranged on a first side of the second groove;
the fourth end is arranged on a second side of the second groove; and
the first side of the second groove is opposite to the second side of the second groove.

5. The seat plate assembly of claim 4, wherein the first welding part further comprises a fifth end;
the fifth end is connected to the first intermediate portion;
the fifth end is configured to extend to or out of a boundary of the base plate along the first groove;
the second welding part further comprises a sixth end;
the sixth end is connected to the second intermediate portion;
the sixth end is configured to extend to or out of the boundary of the base plate along the second groove.

6. The seat plate assembly of claim 3, wherein the base plate is further provided with a third through hole and a fourth through hole;
the third through hole is communicated with the second groove; and
the fourth through hole is communicated with the first groove.

7. The seat plate assembly of claim 1, wherein a first notch and a second notch are arranged spaced apart on the base plate.

8. The seat plate assembly of claim 1, wherein the seat plate assembly further comprises an auxiliary soldering lug;

the auxiliary soldering lug is arranged on a lower end surface of the base plate; and the auxiliary soldering lug is configured for soldering the base plate on the circuit board.

9. An anti-vibration capacitor assembly, comprising:

a capacitor body; and the seat plate assembly of claim 1;

wherein the seat plate assembly is configured to support the capacitor body.

* * * * *